United States Patent

Evans et al.

Patent Number: 6,133,106
Date of Patent: Oct. 17, 2000

[54] FABRICATION OF A PLANAR MOSFET WITH RAISED SOURCE/DRAIN BY CHEMICAL MECHANICAL POLISHING AND NITRIDE REPLACEMENT

[75] Inventors: David Russell Evans, Beaverton, Oreg.; Sheng Teng Hsu, Camas, Wash.

[73] Assignees: Sharp Laboratories of America, Inc., Camas, Wash.; Sharp Kabushiki Kaisha, Osaka, Japan

[21] Appl. No.: 09/028,157

[22] Filed: Feb. 23, 1998

[51] Int. Cl.[7] .................... H01L 21/336; H01L 21/3205; H01L 21/4763

[52] U.S. Cl. .................... 438/299; 438/303; 438/300; 438/595; 438/591

[58] Field of Search .................... 438/299, 303, 438/300, 595, 591

[56] References Cited

U.S. PATENT DOCUMENTS

| | | |
|---|---|---|
| 4,702,792 | 10/1987 | Chow et al. . |
| 4,944,836 | 7/1990 | Beyer et al. . |
| 4,954,142 | 9/1990 | Carr et al. . |
| 5,451,546 | 9/1995 | Grubisich et al. ........... 438/303 |
| 5,656,519 | 8/1997 | Mogami ........... 438/303 |
| 5,786,255 | 7/1998 | Yeh et al. ........... 438/299 |
| 5,821,145 | 10/1998 | Goo ........... 438/294 |
| 5,858,843 | 1/1999 | Doyle et al. ........... 438/299 |

OTHER PUBLICATIONS

Kaufman et al., Chemical–Mechanical Polishing for Fabricating Patterned W Metal Features as Chip Interconnects, J. Electrochem. Soc., vol. 138, No. 11, pp. 3460–3465, Nov. 1991.

Stanley Wolf, Silicon Processing for the VLSI Era, vol. 3—The Submicron MOSFET, pp. 373, Jan. 1, 1995.

*Primary Examiner*—Mary Wilczewski
*Assistant Examiner*—James Park
*Attorney, Agent, or Firm*—David C. Ripma; Matthew D. Rabdau; Scott C. Krieger

[57] ABSTRACT

A method of fabricating a MOSFET includes: depositing an oxide layer on the planarized substrate; forming a silicon nitride island above a gate region in the substrate; building an oxide sidewall about the nitride island; forming a source region and a drain region in the substrate; removing the silicon nitride island, thereby leaving a void over the gate region; forming a gate dielectric over the gate region in the void; filling the void and the areas over the source region and drain region; planarizing the upper surface of the structure by chemical mechanical polishing; depositing a metal layer on the upper surface of the structure; and metallizing the structure to form electrodes in electrical contact with the source region, the gate region, and the drain region.

17 Claims, 5 Drawing Sheets

FABRICATION OF A PLANAR MOSFET WITH RAISED SOURCE/DRAIN BY CHEMICAL MECHANICAL POLISHING AND NITRIDE REPLACEMENT

FIELD OF THE INVENTION

This invention relates to manufacture of integrated circuit, and specifically to manufacturing of MOSFET circuits having a raised source/drain region.

BACKGROUND OF THE INVENTION

Manufacturing of MOSFET semiconductors are well known in the art. Such structures are shown in U.S. Pat. No. 4,702,792 to Chow et al., which discloses a technique for making conductive channels of small size.

U.S. Pat. Nos. 4,944,836 and 4,954,142 to Beyer et al. both describe techniques for chemical-mechanical polishing of silicon-based substrates.

Kaufman et al. have written on such structures in *Journal of the Electrochemical Society*, Volume 138, page 3460, 1991.

Although the aforementioned references discuss the fabrication of a MOSFET device, they do not provide the advantages of the instant invention.

SUMMARY OF THE INVENTION

The method of the invention includes: depositing an oxide layer on a substrate; forming a silicon nitride island above a gate region in the substrate; building an oxide sidewall about the nitride island; forming a source region and a drain region in the substrate; removing the silicon nitride island, thereby leaving a void over the gate region; forming a gate dielectric over the gate region in the void; filling the void and the areas over the source region and drain region; planarizing the upper surface of the structure by chemical mechanical polishing; depositing a metal layer on the upper surface of the structure; and metallizing the structure to form electrodes in electrical contact with the source region, the gate region, and the drain region.

An object of the invention is to provide a method of fabricating a planer MOSFET device with improved global planarization techniques.

Another object of the invention is to provide such a MOSFET device which may be constructed on both conventional silicon and silicon-on-insulator (SOI) substrates.

A further object of the invention is to provide for the fabrication of a MOSFET device which allows the use of any type of gate dielectric material.

Still another object of the invention is to provide for the fabrication of a MOSFET device having a highly conductive material, such as refractory metal or copper, as the gate electrode.

Another object of the invention is to provide for the fabrication of a MOSFET device, which fabrication does not require dry etching of the gate electrode.

These and other objects and advantages of the invention will become more fully apparent as the description which follows is read in conjunction with the drawings.

DETAILED DESCRIPTION OF THE PREFERRED EMBODIMENT

Figure 1:
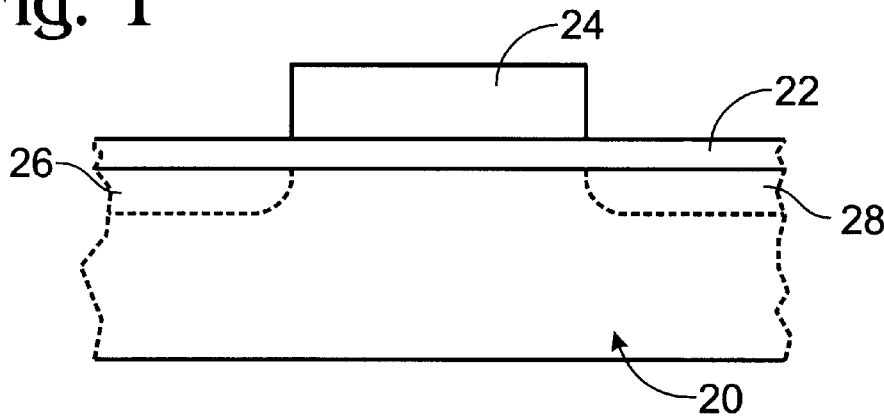
FIGS. 1–10 depict successive steps in the fabrication of a MOSFET device according to the invention.

Turning now to the drawings, and initially to FIG. 1, a substrate, which in this case is a single crystal silicon substrate, is depicted generally at 20. As used herein, "substrate" or "silicon substrate" means a bulk silicon, single crystal substrate, or a Separation by IMplantation of OXygen (SIMOX) silicon substrate. Substrate 20 will have been specially processed to form an electrically active and/or isolated area suitable for subsequent fabrication of the device to be described herein. Preprocessing may include, without limitation, conventional n$^-$well and/or p$^-$well definition and isolation; trench isolation with polysilicon or oxide refills; conventional or fully recessed local oxidation (LOCOS); and/or SOI mesa structure, generated either by LOCOS or etching. Such steps may be combined, or used individually. A silicon-on-insulator (SOI) substrate may be fabricated by high dose oxygen implantation into single crystal silicon, along with subsequent annealing, to form a SIMOX, bonded silicon wafers and etchback, heteroepitaxy, etc. An example of SIMOX is implantation of oxygen at about 200 keV with an oxygen dose of 1 to $2\times10^{18}$ cm$^{-2}$. The wafer is then annealed at 1300° C. to 1350° C. for four to ten hours. The buried oxide thickness is about 300 nm.

Once the preprocessing is complete, the substrate may be planarized, i.e., rendered globally planar by chemical mechanical polishing (CMP).

A layer of oxide 22 is formed on substrate 20 to a thickness of approximately 30 nm. (It should be noted that the drawings are not to scale.) A layer of silicon nitride is then deposited to a thickness of 150 nm to 400 nm, by low pressure chemical vapor deposition (LPCVD). The layer of silicon nitride is formed into a nitride island 24 by a process of photolithography and etching. Nitride island 24 forms a dielectric image of what will become the gate electrode. This image will be transferred into a polysilicon material without a separate photolithography step, which will be described later herein.

Photoresist is used to mask the n$^-$channel transistors from p$^-$LDD ion implantation. Low Dose Drain (LDD) formation refers to a low dose ion implantation which is used herein to describe, generally, low dose ion implantation regardless of the intended use of the region being implanted. The p$^-$LDD regions, 26 and 28, are formed by BF$_2$ ion implantation. The preferred ion dose is 5 to $50\times10^{13}$ cm$^{-2}$ and the BF$_2$ ion energy is 10 keV to 80 keV. The ion energy is sufficiently low so that no ions are implanted through the nitride layer. The photoresist is stripped and a new photoresist is used to mask the p$^-$channel transistors for n$^-$LDD ion implantation. The n$^-$LDD region is formed by implantation of arsenic or phosphorus ions at an ion dose of 5 to $50\times10^{13}$ cm$^{-2}$ and an ion energy of 40 keV to 100 keV for arsenic or an ion energy of 10 keV to 60 keV for phosphorous.

Figure 2:
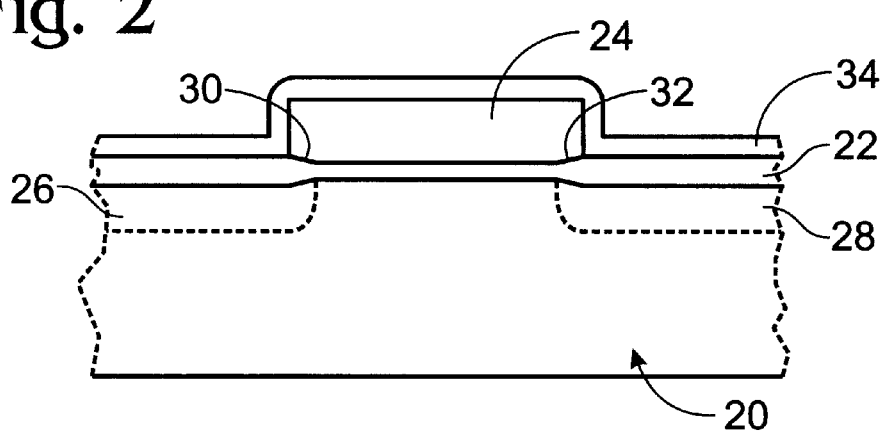

An optional step of oxidation may be performed for the purpose of thickening the pad oxide 22, which results in the formation of a "bird's beak" at the edge of the nitride, as is depicted at 30 and 32 in FIG. 2. The bird's beak may enhance the breakdown voltage of the gate oxide at the edge of the gate electrode. During this oxidation step the ions in the LDD region are diffused and are extended beyond the length of the bird's beak, as is shown in FIG. 2. An oxide layer 34 is deposited over the structure by any state-of-the-art process, such as LTO or PECVD, resulting in the configuration shown in FIG. 2.

Figure 3:
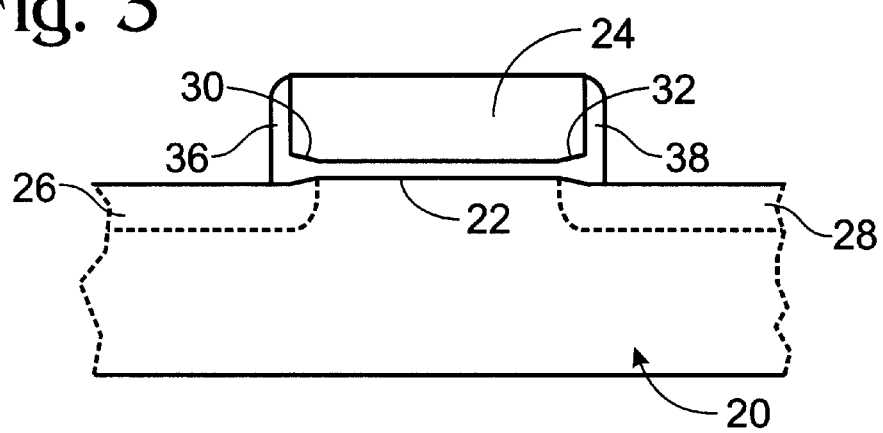
Figure 4:
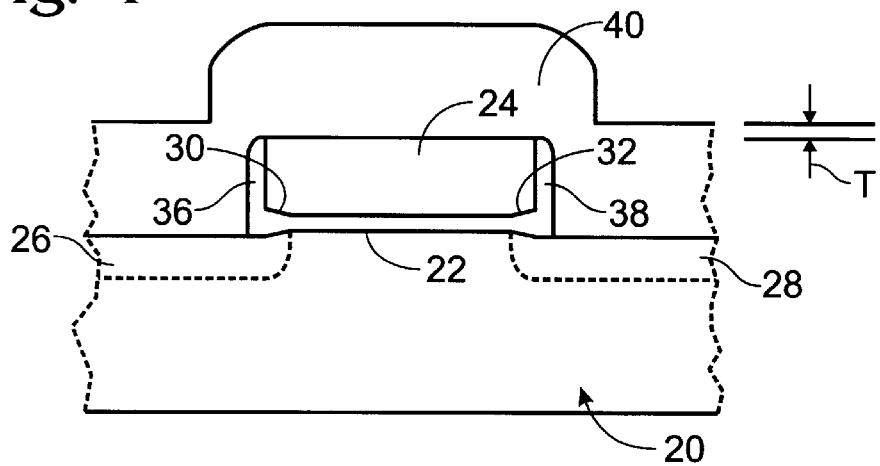
Figure 5:
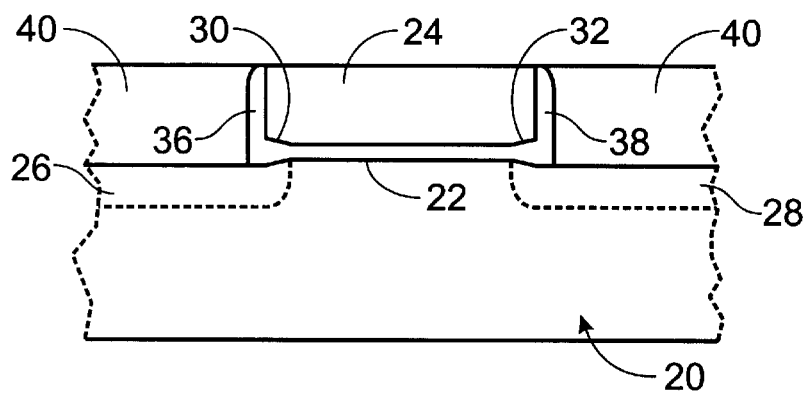
Figure 6:
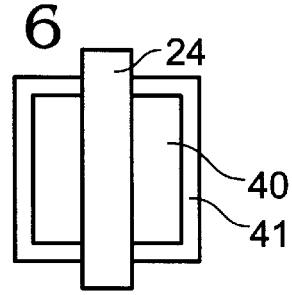

The wafer is then subject to an anisotropic oxide etch, which leaves a thin layer of oxide 36 and 38 about the sidewall of the nitride layer, as shown in FIG. 3. Referring now to FIG. 4, a layer of polysilicon, 40, is deposited onto the wafer. Layer 40 is thicker than nitride layer 24 by an amount "T". The structure is treated by CMP to expose the nitride island 24, as shown in FIG. 5. A photoresist mask is then applied to cover the device active area. Polysilicon layer 40 in the field regions is not covered by the resist. The polysilicon is etched. The etching stops at the upper surface of the oxide and nitride layers. The resist is stripped. At this point only the source region 26 and the drain region 28 of both p⁻channel and n⁻channel transistors are covered with polysilicon layer 40. The wafer is then coated with a layer of oxide (not shown) having thickness equal to or thicker than that of nitride layer. The oxide is CMP planarized, stopping at the upper surface of the polysilicon and nitride layers. This results in an isolating oxide region 41, as shown in FIG. 6, which surrounds the polysilicon layer 40, which isolating oxide region insulates the devices on the substrate from one another. Region 41, shown only in the top plan view of FIG. 6, should be understood to be present in the other drawing figures after the steps described in connection with FIG. 5.

Figure 7:
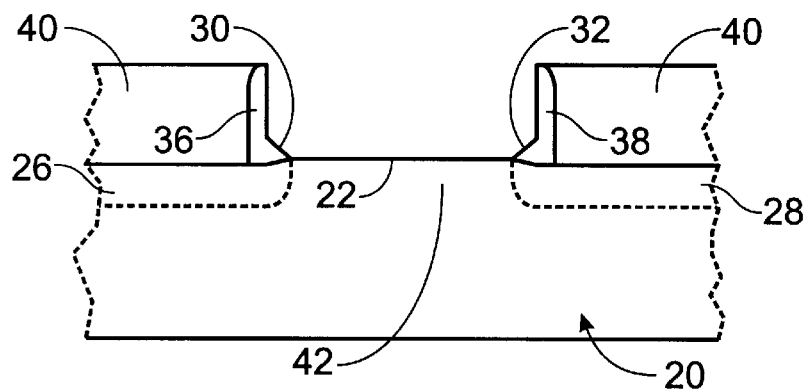

Nitride island 24 is removed by phosphoric acid reflux, resulting in the configuration shown in FIG. 7. Upon removal of the nitride, a remnant of the original pad oxide 22 is exposed. Although this oxide layer could serve as the gate dielectric, it is unlikely that the remains of the pad oxide would be uncontaminated or undamaged following the phosphoric acid reflux step. Pad oxide 22 could serve as a screen oxide for an unmasked threshold adjustment implant which would, of course, certainly result in the contamination of oxide pad 22. Once oxide pad 22 is removed, a channel region 42 is exposed, which requires placement of some form of gate dielectric thereover.

While the simplest approach to forming a gate dielectric, as disclosed in the cited references, is regrowth of a dielectric on the exposed silicon in channel region 42, such regrowth will result in edge thinning, which will ultimately cause the resulting device to have an undesirable low gate breakdown voltage. This effect may be reduced by judicious design of the aforementioned LOCOS step, above. During the LOCOS step, bird's beak 30, 32 is formed around the periphery of the nitride island, resulting in thickening of the pad oxide at the edge of the gate. If the remnant pad oxide strip is carefully controlled, a "toe" will be formed at the bottom of the spacer (36, 38), which offsets the edge thinning.

Alternatively, gate dielectric may be formed by some form of deposition. This may be advantageous because materials other than silicon oxide, which have desirable material properties, such as high dielectric constant and/or high breakdown strength, such as AlN, $Al_2O_3$, $TiO_2$, or $Ta_2O_5$, may be used. In this instance, LOCOS is not needed and the step may be deleted from the process flow. The materials may be deposited by CVD, PVD, or atomic layer deposition (ALD). The end result, regardless of which method is used, is the formation of a gate dielectric layer 44, as shown in FIG. 8.

Figure 8:
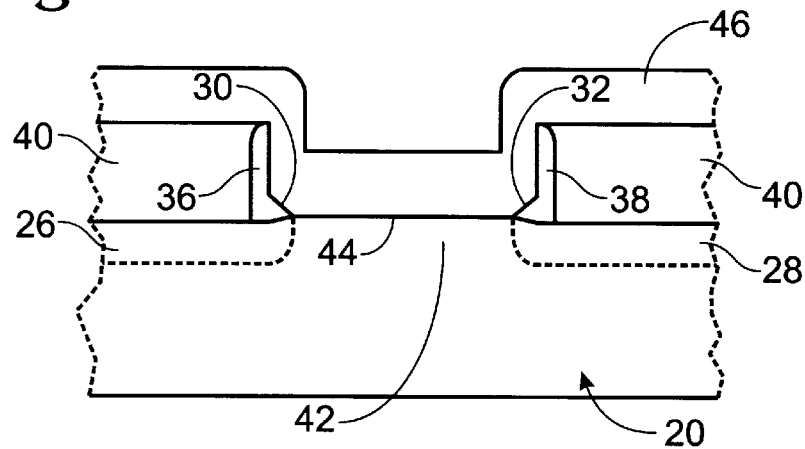
Figure 9:
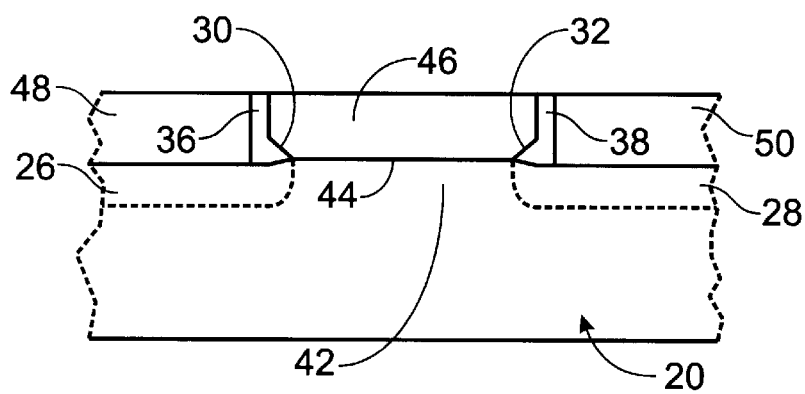

After formation of gate dielectric 44, a second layer of polysilicon 46 is deposited over the entire structure, resulting in the configuration depicted in FIG. 8. Material other than polysilicon, however, may be used to fill the void over the source, gate and drain regions. A refractory metal, such as tungsten (W), tantalum (Ta), platinum (Pt), or molybdenum (Mo), or copper (Cu) in combination with a barrier metal, such as titanium nitride (TiN), tantalum nitride (TaN) or tungsten nitride (WN), may be used. Once the structure is covered with whatever material is selected, the structure undergoes global planarization (CMP) to remove portions of polysilicon layers 40, 46 and portions of sidewall spacers 36, 38.

The next step is p⁻channel source/drain ion implantation. Photoresist is used to mask the n⁻channel transistor. The p⁻channel source/drain region is implanted with $BF_2$ ions. The preferred ion dose is 1.0 to $5.0 \times 10^{15}$ cm⁻² and the $BF_2$ ion energy is 10 keV to 80 keV. Again, the ion energy is sufficiently low so that no ions are implanted through the gate dielectric layer. This ion implantation creates p⁺ source region 48 and p⁺ drain region 50 for a p⁻channel transistor. The photoresist is stripped and a new photoresist is used to mask the p⁻channel transistors for n⁻channel source/drain ion implantation.

The n⁻channel source/drain is formed by implantation of arsenic (or phosphorus) ions at an ion dose of 1.0 to $5.0 \times 10^{15}$ cm⁻² and arsenic ion energy of 40 keV to 100 keV, or phosphorus energy of 10 keV to 60 keV. The masking resist is stripped and the wafer annealed in an inert gas ambient atmosphere at a temperature of between about 800° C. to 1100° C. for 15 seconds to 60 minutes. The gate 46, the source, 48 and the drain 50 of the p⁻ channel transistor are doped to p⁺, while the corresponding layers of the n⁻channel transistor are doped to n⁺. This results in completion of the transistor structure, which requires only to have oxide passivation and metallization to complete the working device.

An optional salicide (self-aligned silicide) process may also be performed to minimize the parasitic resistance of the gate, source, and drain electrodes. Silicide layers 52, 54 may be formed by any state-of-the-art salicide process, however, a problem in the salicide prior art is that the gate may be shorted to the source and/or drain by unetched metal which remains on the spacer oxide. This problem is resolved by a "touch polish", a very short CMP step.

Figure 10:
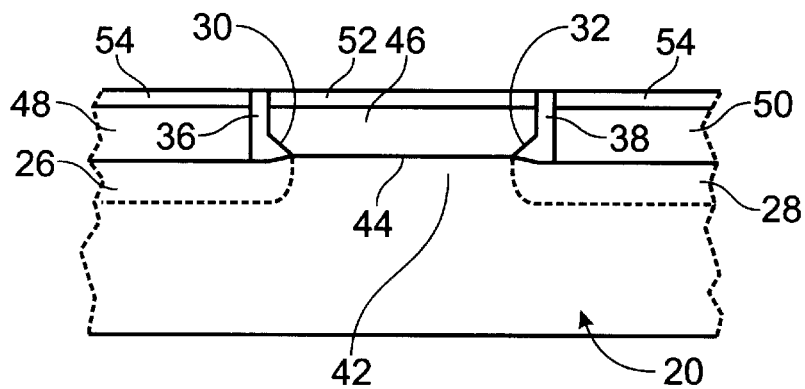

The device in FIG. 10 is now ready for conductor metalization, which may be accomplished by any of the techniques well known to those of skill in the art to form electrodes for the source region, gate region, and drain region, which electrodes are in electrical contact with their respective regions. This may be accomplished by conventional patterning and etching metalization, such as with an aluminum alloy. However, because the surface is already globally planarized, an inlaid metalization using copper and CMP may easily be implemented.

Figure 11:
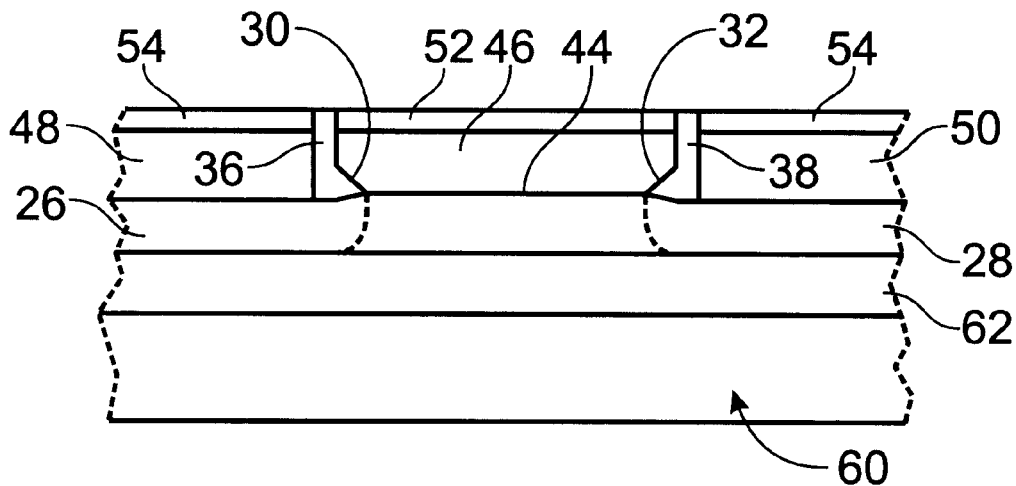
FIG. 11 depicts the device on a SIMOX substrate.

Referring now to FIG. 11, the structure is shown on a SIMOX substrate, having a bulk silicon layer 60 and a buried oxide layer 62. The remaining structures are indicated by previously used reference numbers for like elements.

Figure 12:
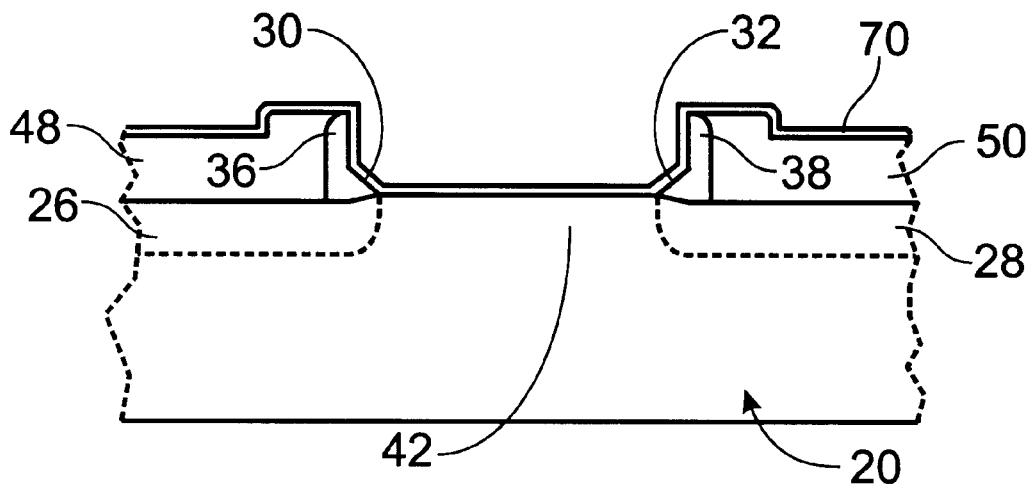
FIG. 12 depicts the device structure after gate dielectric deposition.
Figure 13:
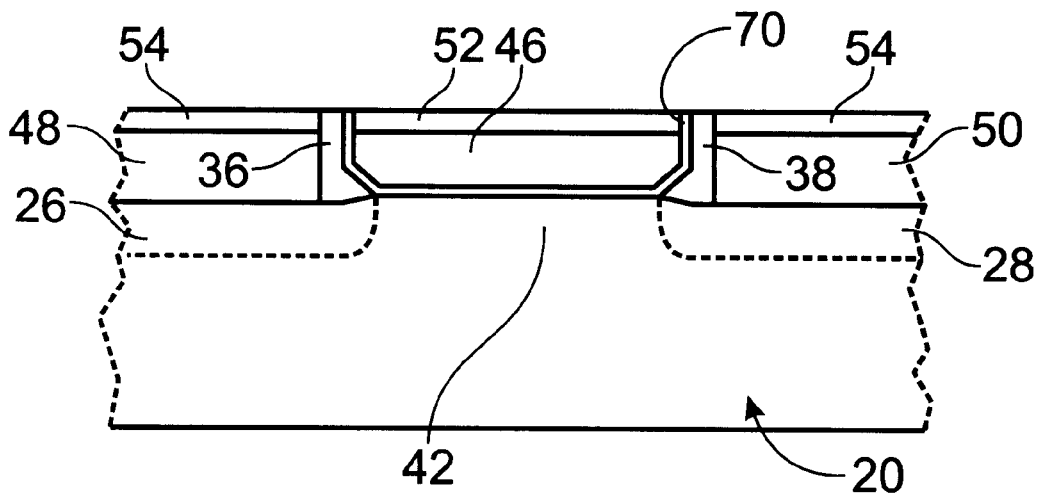
FIG. 13 depicts the completed device structure with the deposited gate dielectric.
Figure 14:
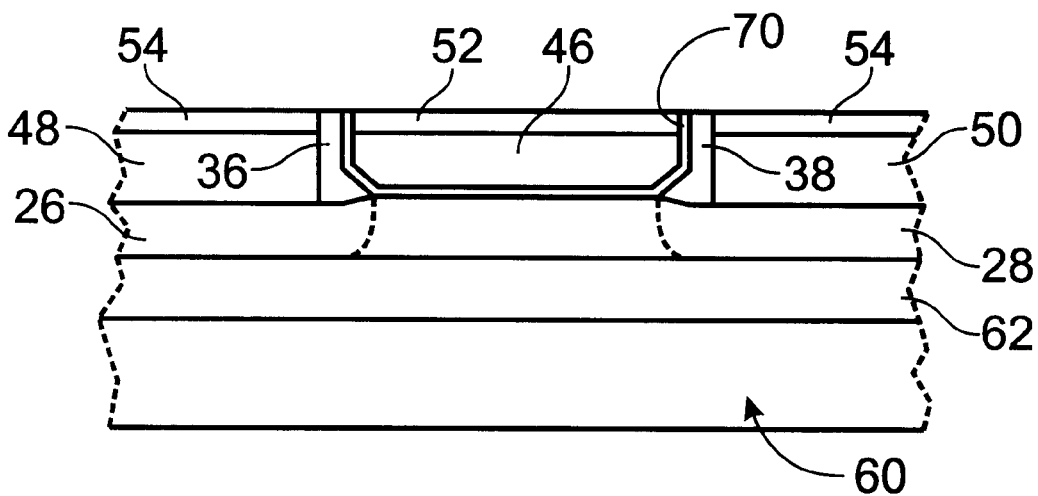
FIG. 14 depicts the completed structure with deposited gate dielectric on SIMOX substrate.

As previously mentioned, in some instances, a gate dielectric layer may be deposited rather than using conventional gate oxidation. This is depicted in FIG. 12 on bulk silicon substrate 20 wherein a dielectric layer 70 is deposited. The excess dielectric material on the source and drain regions is removed by CMP, which results in a natural self-alignment of the gate dielectric to the gate electrode as shown in FIGS. 13 and 14, on bulk silicon and SIMOX substrates, respectively.

Thus, a method of forming a planar MOSFET having a raised source/drain therein has been disclosed. Although a preferred method of forming the structure, and a SIMOX variation thereof, have been disclosed, it should be appreciated that further variations and modifications may be made thereto without departing from the scope of the invention as defined in the appended claims.

We claim:

1. A method of fabricating a planar MOSFET comprising:

depositing an oxide layer on planarized silicon substrate for device isolation;

forming a silicon nitride island above a gate region in the substrate;

building an oxide sidewall about the nitride island;

forming a source region and a drain region in the substrate;

removing the silicon nitride island, thereby leaving a void over the gate region;

forming a gate dielectric over the gate region in the void;

filling the void and the areas over the source region and drain region;

planarizing the upper surface of the structure by chemical mechanical polishing;

depositing a metal layer on the upper surface of the structure; and metallizing the structure to form electrodes in electrical contact with the source region, the gate region, and the drain region.

2. The method of claim 1 which includes planarizing the substrate by chemical mechanical polishing.

3. The method of claim 1 wherein said depositing an oxide layer includes depositing silicon oxide to a thickness of about 30 nm.

4. The method of claim 1 wherein said forming a silicon nitride island includes depositing a layer of silicon nitride to a thickness of about 150 nm to 400 nm over the oxide layer; masking the silicon island area; and etching the silicon nitride to remove the layer except for the area over the gate region.

5. The method of claim 4 which includes forming a birds beak structure about the lower periphery of the silicon nitride island.

6. A method of fabricating a planar MOSFET comprising:

depositing an oxide layer on planarized silicon substrate for device isolation;

forming a silicon nitride island above a gate region in the substrate;

building an oxide sidewall about the nitride island;

forming a source region and a drain region in the substrate;

depositing a first polysilicon layer over the silicon nitride island, the sidewalls of the silicon nitride island, and the source region and the drain region;

chemically mechanically polishing the structure to the top of the silicon nitride island;

removing the silicon nitride island by dissolving the silicon nitride island with a solvent thereby leaving a void over the gate region;

forming a gate dielectric over the gate region in the void;

filling the void and the areas over the source region and drain region;

planarizing the upper surface of the structure by chemical mechanical polishing;

depositing a metal layer on the upper surface of the structure; and metallizing the structure to form electrodes in electrical contact with the source region, the gate region, and the drain region.

7. The method of claim 6 which further includes removing the first polysilicon layer over the field oxide areas, depositing a silicon oxide layer over the remaining first polysilicon layer, and chemically mechanically polishing the structure to remove material down to the level of the top of the first polysilicon layer.

8. The method of claim 1 wherein said forming a gate dielectric includes depositing a material having a high dielectric constant and a high breakdown strength.

9. The method of claim 1 which includes, prior to said metallizing the structure, annealing the structure to promote a salicide process.

10. The method of claim 1 wherein said filling includes filling the void and the areas over the source region and drain region with material taken from the group consisting of polysilicon, copper with a barrier metal, tungsten, molybdenum, tantalum and platinum.

11. A method of fabricating a planar MOSFET comprising:

preparing a silicon substrate to include an active region which will provide a gate region;

planarizing the prepared substrate by chemical mechanical polishing;

depositing an oxide layer on the planarized substrate for device isolation;

forming a silicon nitride island above a gate region in the substrate by depositing a layer of silicon nitride to a thickness of between about 150 nm to 400 nm over the oxide layer;

masking the silicon island area; and etching the silicon nitride to remove the layer except for the area over the gate region;

building an oxide sidewall about the nitride island;

forming a source region and a drain region in the substrate;

removing the silicon nitride island, thereby leaving a void over the gate region;

forming a gate dielectric over the gate region in the void;

filling the void and the areas over the source region and drain region with material taken from the group consisting of polysilicon, copper with a barrier metal, tungsten, molybdenum, tantalum and platinum;

planarizing the upper surface of the structure by chemical mechanical polishing;

depositing a metal layer on the upper surface of the structure; and metallizing the structure to form electrodes in electrical contact with the source region, the gate region, and the drain region.

12. The method of claim 11 wherein said depositing an oxide layer includes depositing silicon oxide to a thickness of about 30 nm.

13. The method of claim 11 which includes forming a birds beak structure about the lower periphery of the silicon nitride island.

14. A method of fabricating a planar MOSFET comprising:

preparing a silicon substrate to include an active region which will provide a gate region;

planarizing the prepared substrate by chemical mechanical polishing;

depositing an oxide layer on the planarized substrate for device isolation;

forming a silicon nitride island above a gate region in the substrate by
  depositing a layer of silicon nitride to a thickness of between about 150 nm to 400 nm over the oxide layer;
  masking the silicon island area; and
  etching the silicon nitride to remove the layer except for the area over the gate region;

building an oxide sidewall about the nitride island;

forming a source region and a drain region in the substrate;

depositing a first polysilicon layer over the silicon nitride island, the oxide sidewalls of the silicon nitride island, and the source region and the drain region;

chemically mechanically polishing the structure to the top of the silicon nitride island;

removing the silicon nitride island by dissolving the silicon nitride island with a solvent, thereby leaving a void over the gate region;

forming a gate dielectric over the gate region in the void;

filling the void and the areas over the source region and drain region with material taken from the group consisting of polysilicon, copper with a barrier metal, tungsten, molybdenum, tantalum and platinum;

planarizing the upper surface of the structure by chemical mechanical polishing;

depositing a metal layer on the upper surface of the structure; and metallizing the structure to form electrodes in electrical contact with the source region, the gate region, and the drain region.

15. The method of claim 14 which further includes removing the first polysilicon layer over the field oxide areas, depositing a silicon oxide layer over the remaining first polysilicon layer, and chemically mechanically polishing the structure to remove material down to the level of the top of the first polysilicon layer.

16. The method of claim 11 wherein said forming a gate dielectric includes depositing a material having a high dielectric constant and a high breakdown strength.

17. The method of claim 11 which includes, before said metallizing, annealing the structure to promote a salicide process.

* * * * *